United States Patent [19]

Ishii et al.

[11] Patent Number: 5,016,083
[45] Date of Patent: May 14, 1991

[54] SUBMOUNT FOR SEMICONDUCTOR LASER DEVICE

[75] Inventors: Mitsuo Ishii, Itami; Hidenori Nishihara, Fukuoka, both of Japan

[73] Assignee: Mitsubishi Denki Kabushiki Kaisha, Japan

[21] Appl. No.: 544,375

[22] Filed: Jun. 27, 1990

[30] Foreign Application Priority Data

Jan. 12, 1990 [JP] Japan ............................. 2-5176

[51] Int. Cl.⁵ .................... H01L 23/48; H01L 39/02; H01S 3/04
[52] U.S. Cl. .............................. 357/71; 372/34; 372/36; 357/80
[58] Field of Search .................. 372/34, 36; 357/71, 357/80, 81

[56] References Cited

U.S. PATENT DOCUMENTS 4,947,238 8/1990 Ishii et al. .................... 357/71

FOREIGN PATENT DOCUMENTS

| 0042285 | 3/1983 | Japan | 372/36 |
| 58-58786 | 4/1983 | Japan . | |
| 0091692 | 5/1983 | Japan | 372/36 |
| 0052079 | 3/1985 | Japan | 372/36 |
| 60-103860 | 7/1985 | Japan . | |
| 62-10461 | 1/1987 | Japan . | |

Primary Examiner—Georgia Epps
Attorney, Agent, or Firm—Leydig, Voit & Mayer

[57] ABSTRACT

A semiconductor laser device submount disposed between a semiconductor laser chip and a metal block for securing them together includes a metallization structure on each of two opposing surfaces of an Sb-doped submount body. The metallization includes a first Au layer on the surface of the body, an AuSb layer on the first Au layer, and a second Au layer on the AuSb layer.

6 Claims, 2 Drawing Sheets

SUBMOUNT FOR SEMICONDUCTOR LASER DEVICE

This invention relates to a submount for use in securing a semiconductor laser chip onto a heat dissipating metal block and, more particularly to a semiconductor laser device submount which has Au-AuSb-Au three-layered metallization structures on opposing surfaces thereof.

BACKGROUND OF THE INVENTION

A semiconductor laser is a current-to-light converting device which emits light in response to injection of current into it. Generally, light is generated in a structurally minute region. A portion of the injected current which does not contribute to generation of light is transformed into heat. The characteristics of a semiconductor laser greatly depend on how efficiently this heat can be dissipated. In order to efficiently dissipate heat, a laser chip is mounted on a metal block which has high thermal conductivity. The laser chip is usually scoured to the metal block by means of a submount disposed therebetween, so that thermal stress distortion due to difference in thermal expansion coefficient between the laser chip and the metal block does not cause degradation of characteristics of the laser chip which would shorten the life of the laser device.

FIG. 1 shows an example of a semiconductor laser device which includes a laser chip secured to a metal block by means of a conventional submount. In FIG. 1, an Si submount 1 comprises an Si submount body 2 doped with for example Sb. On each of opposite surfaces of the body 2, an Au layer 3 is formed by sputtering, and another Au layer 5 is formed on the Au layer 3 by plating. A laser chip 6 is mounted on a metal block 7 by means of the submount 1. The metal block 7 may be a block of Cu having surfaces plated with Au for preventing oxidation of the block, or it may be an Ag block. The material of the block has high heat dissipation capability. The reason why the Au layer on each of the opposed surfaces of the Si submount body 1 is made to be a two-layered structure comprising the sputtered Au layer 3 and the plated Au layer 5 is as follows. That is, generally, the Au layers on the opposited surfaces of the body 2 should have a thickness of about 5 $\mu$. It will take a very long time and, therefore is, practically impossible to form a 5 $\mu$ Au layer solely by sputtering. In contrast, plating can form an Au layer having 5 $\mu$ thickness in a relatively short time, but adhesion of a plated Au layer to an Si submount body is poor so that such an Au layer may be easily peeled off during subsequent dicing, for example. Therefore, an Au layer (3) of 0.2 $\mu$ thickness is first sputtered, which has good adhesion to the Si body, and an Au layer (5) of 4.8 $\mu$ to 5 $\mu$ thickness is then plated on the sputtered Au layer.

A stack comprising the laser chip 6, the Si submount 1 and the metal block 7, as shown in FIG. 1, is placed on a heating apparatus (not shown), and a predetermined compressive of force is applied, while applying current to a heater of the heating apparatus to thereby heat the stack to about 400°C. This heating diffuses part of the Sb in the Si submount body 2 into the sputtered Au layer 3 and the plated Au layer 5 on each side of the body 2, so that an AuSiSb eutectic solder is formed between the Si submount body 2, the sputtered Au layer 3 and the plated Au layer 5. Thus, the bonding of the laser chip 6 to the Si submount 1 and the bonding of the submount 1 to the metal block 7 are achieved simultaneously.

With the above-described conventional semiconductor laser device submount structure, diffusion into the Au layers of Sb contained in the Si submount body 2 may be insufficient and, therefore, AuSiSb eutectic solder of uniform resistance distribution cannot be formed. Therefore, the resistance of Si submounts 1 in the thickness direction, after heat treatment in each bonding step of the device assembling process in which AuSiSb eutectic solder is formed, may vary greatly, and a number of products have to be rejected because of out-of-specification resistance of their submounts.

FIG. 4 shows variations of resistance values R of conventional Si submounts 1 shown in FIG. 1 measured in the thickness direction after each bonding step. While the allowable highest value is 10 $\Omega$, the resistance values R in the thickness direction of the Si submounts 1 vary over a range of from about 5 $\Omega$ to about 15 $\Omega$ after the heat treatment of the die bonding step (D/B) for mounting the laser chip 6 to the metal block 7 via the submount 1 after the heat treatment in the subsequent block bonding step (B/B) for mounting the metal block 7 to a package (not shown), the resistance values R may vary over a range of from about 5 $\Omega$ to about 17 $\Omega$. The resistance value R may have variations of from about 5 $\Omega$ to about 15 $\Omega$ after the heat treatment of the final wire bonding step (W/B). It has been recognized that the ultimate percent of defective products may reach up to 30% to 50%.

Japanese Utility Model application No. SHO 60-100735 (Japanese UM Published application No. SHO 62-10461) shows an Si submount which comprises an Si submount body having an Au-Sb alloy layer formed on each of its opposing surfaces so that the ohmic contact at the surfaces of the Si submount is improved. According to this Japanese UM published application, an Au-Sb alloy layer is formed on the surface of an Si heat sink (which corresponds to the Si submount body) on the side where a semiconductor laser chip is to be secured. Then, a Pt layer acting as a barrier, an Au layer and an In layer are formed sequentially in a stack in the named order on the Au-Sb alloy layer. On the surface of the Si heat sink which is to be secured to a stem (which corresponds to the metal block), an Au-Sb alloy layer, a Pt layer and an Sn layer are sequentially formed. The Si heat sink and the stem are bonded together by means of an In-Sn alloy solder.

The Si submount shown in this Japanese UM Published application No. SHO 62-10461 has a feature common to the present invention, which is fully described later, in that an Au-Sb layer is used in order to improve ohmic contact to the Si submount body. However the invention of this Japanese UM published application requires a sintering step for forming the Au-Sb layer, and also a chemical treatment must be provided, prior to the subsequent metallization of the Au-Sb layer with the Pt (barrier) layer, in order to improve adhesion of the Pt layer to the Au-Sb layer. Consequently, the number of wafer processing steps increases, which causes an increase of manufacturing costs. Further, because of the increase in the number of steps, the device of this Japanese UM published application is not suitable for mass-production. In addition, because the chemical surface treatment may provide large variations in surface conditions and may leave treatment chemicals on the surfaces, insufficient adhesion and/or degradation of electric characteristics of devices would result. Thus, the resulting devices lack reliability.

Therefore, an object of the present invention is to provide an improved submount for a semiconductor laser device which is free of the above-stated disadvantages of conventional submounts. This object is achieved by the present invention in which Sb is diffused highly uniformly into an AuSi eutectic solder when the AuSi eutectic solder is formed so that the submounts have less variation in resistance in the thickness direction and, therefore, the semiconductor laser devices have stable characteristics.

SUMMARY OF THE INVENTION

The submount for a semiconductor laser device according to the present invention comprises a submount body doped with Sb and a metallization layer structure on each of opposing surfaces of the submount body. Each of the metallization layer structures comprises a first Au layer on the surface of the submount body, an AuSb layer on the first Au layer and a second Au layer on the AuSb layer which are formed sequentially in the named order.

When this submount is used to secure a semiconductor laser chip to a metal block, Sb in the AuSb layer disposed between the first Au layer and the second Au layer is diffused together with Sb in the submount body into the AuSi eutectic solder and mixed with the AuSi eutectic solder, which results in a homogeneous AuSiSb eutectic solder layer.

DESCRIPTION OF PREFERRED EMBODIMENT

Figure 2:
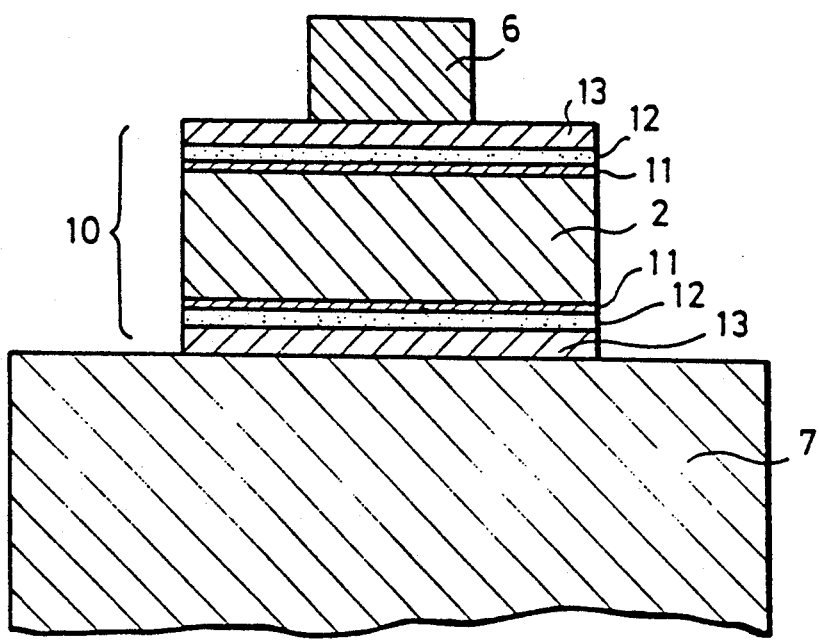
FIG. 2 shows how a laser chip secured to a metal block with a semiconductor laser device submount according to the present invention.

Now, the present invention is described, referring to an embodiment of a semiconductor laser device submount shown in FIG. 2. The submount 10 of FIG. 2 is an Si submount, which comprises an Si submount body 2 doped with Sb, and a multi-layered metallization structure comprising a sputtered Au layer 11, an AuSb layer 12 and a plated Au layer 13 sequentially formed in the named order on each of opposing surfaces of the submount body 2. As in conventional devices, the laser chip 6 is bonded to the metal block 7 by means of the submount 10. The metal block 7 is a block which can efficiently dissipate heat, such as, for example, a Cu block having a surface plated with Au, and an Ag block.

Figure 1:
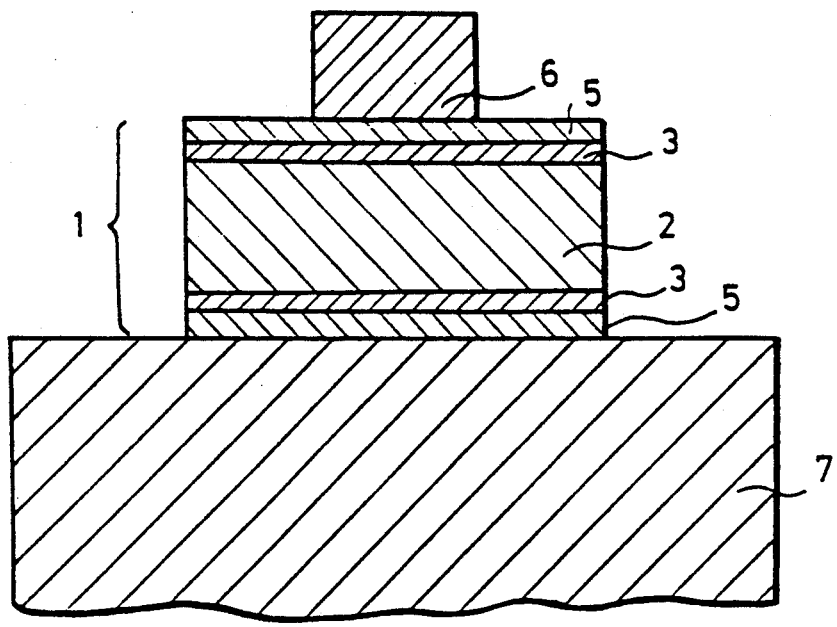
FIG. 1 shows how a laser chip secured to a metal block with a conventional semiconductor laser deviCe submount.

For a laser chip 6 having a thickness of 100 $\mu$ and a height and a width of about 300 $\mu$ and about 200 $\mu$, the thickness, the height and the width of the Si submount body 2 used are about 270 $\mu$ about 400 $\mu$ and about 300 $\mu$. The Si submount body 2 is doped with from 0.11 to 0.21 weight percent, preferably 0.16 weight percent, of Sb, which results in a resistivity $\rho$ of the Si submount body 2 of 0.005–0.017 $\Omega$.cm. The sputtered Au layer 11 is formed to a thickness of 0.2±0.04 $\mu$. and the AuSb layer 12 is formed by vapor deposition or sputtering to a thickness of 0.2±0.04 $\mu$. The plated Au layer 13 is formed to a thickness of 5±1 $\mu$. The metal block 13 has a thickness of about 1400 $\mu$, and has a height of about 1600 $\mu$ and a width of about 1600 $\mu$. As explained with respect to the conventional submount shown in FIG. 1, the reason why the Au layer 11 is formed by sputtering is that a sputtered Au layer has good adhesion to the Si submount body 2, and the reason why the Au layer 13 is formed by plating is that an Au layer when plated, can be formed to a desired thickness in a short time.

The laser chip 6, the submount 10 and the metal block 7 stacked as shown in FIG. 2 are placed in a heating apparatus (not shown). and the positional relationship between these three components is adjusted. Then, a weight of, for example, about 20 g is placed on the top surface of the laser chip 6, and current is applied to flow through a heater of the heating apparatus so that the assembly comprising the three components is heated to 400° C. or higher. This heat treatment results in the formation of an AuSi eutectic solder layer on each of the opposing surfaces of the Si submount body 2. Sb in the Sb-doped Si submount body 2 and Sb in the AuSb layer 12 are diffused into the AuSi eutectic solder layer, and AuSiSb eutectic solder layers comprising a highly homogeneous mixture of Au, Si and Sb are formed. The thus formed AuSiSb eutectic solder layers bond the laser chip 6 to the Si submount 10 and at the same time the Si submount 10 to the metal block 7.

Figure 3:
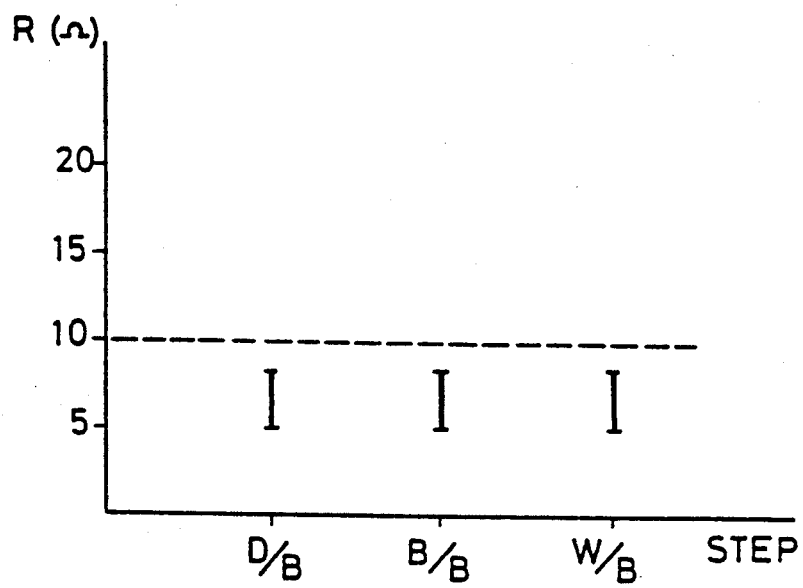
FIG. 3 shows variations in resistance values in the thickness direction of the submount of FIG. 2 after each bonding step.
Figure 4:
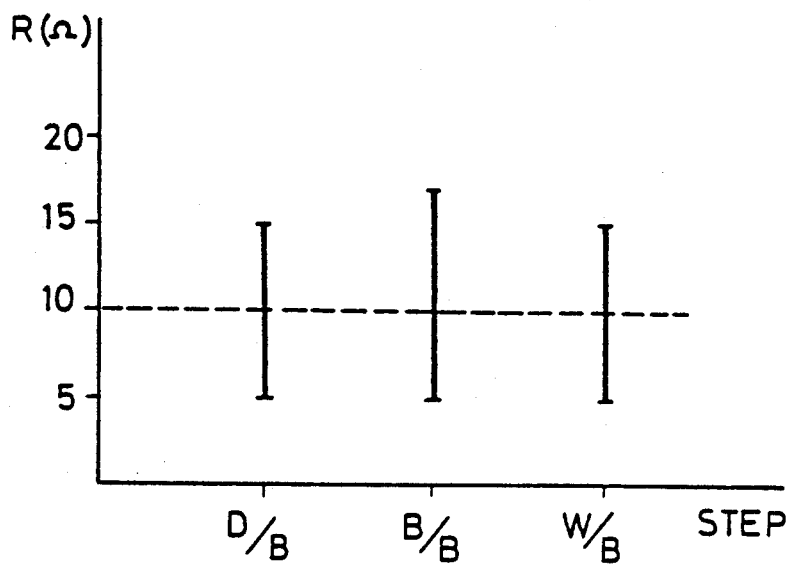
FIG. 4 shows variations in resistance values in the thickness direction of the submount of FIG. 1 after each bonding step.

Semiconductor laser devices were made using the Si submounts of the present invention, and the resistance values R in the thickness direction of the Si submounts were measured after the heat treatment of each of the bonding steps. It has been found that variations in the resistance values R are significantly smaller than those of conventional Si submounts, such as the one shown in FIG. 1, and that almost all of the submounts have resistance values within the allowable range. This is shown in FIG. 3. As shown in FIG. 3, the resistance values R measured after the respective bonding steps, namely, the die bonding step (D/B). the block bonding step (B/B) and the wire bonding step (W/B), are all within a range of from 5 $\Omega$ to 9 $\Omega$. It has been revealed that the percent defective is less than 1%.

The present invention has advantages over the invention disclosed in the aforementioned Japanese UM Published application No. SHO 62-10461 that the number of steps for manufacturing the semiconductor laser devices of the present invention is less that no troublesome surface treatment is required and that the devices of the present invention are more reliable and have a longer life.

The values, such as the sizes of various parts, the Sb concentrations etc. used in the description of the illustrated embodiment are only examples, and they may be varied as occasion demands within the scope of the present invention.

What is claimed is:

1. A semiconductor laser device submount for securing a semiconductor laser chip to a metal block comprising:
   a submount body doped with Sb; and
   a metallization structure disposed on each of two opposing surfaces of said Sb-doped submount body, said metallization structure comprising a first Au layer, an AuSb layer, and a second Au layer sequentially disposed in the named order on each of the surfaces.

2. A semiconductor laser device submount according to claim 1 wherein the submount body is Si doped with Sb.

3. A semiconductor laser device submount according to claim 1 wherein the first Au layer has a thickness of $0.2\pm0.04$ $\mu$, the AuSb layer has a thickness of $0.2\pm0.04$ $\mu$, and the second Au layer has a thickness of $5\pm1$ $\mu$.

4. A semiconductor laser device submount according to claim 2 wherein during heat treatment for securing the laser chip to the metal block, an AuSi eutectic solder layer is formed on each of the opposing surfaces of the Si submount body, and Sb in the Sb-doped Si submount body in the AuSb layer is diffused and uniformly mixed into said AuSi eutectic solder layers to thereby form homogeneous AuSiSb eutectic solder layers.

5. A semiconductor laser device submount according to claim 2 wherein the Si submount body is doped with from 0.11 to 0.21 weight percent of Sb.

6. A semiconductor laser device submount according to claim wherein the Sb-doped Si submount body has a resistivity of from to 0.017 $\Omega$.cm.

* * * * *

UNITED STATES PATENT AND TRADEMARK OFFICE
CERTIFICATE OF CORRECTION

PATENT NO. : 5,016,083
DATED : MAY 14, 1991
INVENTOR(S) : ISHII ET AL

It is certified that error appears in the above-identified patent and that said Letters Patent is hereby corrected as shown below:

Column 6, line 10, after "from" insert --0.005--.

Signed and Sealed this

Sixth Day of October, 1992

Attest:

DOUGLAS B. COMER

Attesting Officer

Acting Commissioner of Patents and Trademarks